(12) United States Patent
Lee

(10) Patent No.: US 8,076,742 B2
(45) Date of Patent: Dec. 13, 2011

(54) IMAGE SENSOR AND METHOD FOR MANUFACTURING THE SAME

(75) Inventor: Byung-Ho Lee, Gwangmyeong-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 18 days.

(21) Appl. No.: 12/611,208

(22) Filed: Nov. 3, 2009

(65) Prior Publication Data

US 2010/0108973 A1 May 6, 2010

(30) Foreign Application Priority Data

Nov. 5, 2008 (KR) ........................ 10-2008-0109293

(51) Int. Cl.
*H01L 31/0232* (2006.01)
*H01L 29/04* (2006.01)

(52) U.S. Cl. .......... 257/432; 257/72; 257/232; 257/233; 257/433; 257/434; 257/435; 257/E21.211; 257/E31.113; 257/E31.127; 257/E31.128; 438/65; 438/70; 65/37

(58) Field of Classification Search ..................... 257/72, 257/232, 233, 432, 433, 434, 435, E21.211, 257/E31.113, E31.127, E31.128; 438/65, 438/70; 65/37
See application file for complete search history.

(56) References Cited

U.S. PATENT DOCUMENTS

| 6,040,591 A * | 3/2000 | Otsuka ........................... 257/232 |
| 7,791,158 B2 * | 9/2010 | Jeong et al. ..................... 257/440 |
| 2007/0110358 A1 * | 5/2007 | Hu et al. ........................... 385/14 |
| 2009/0020700 A1 * | 1/2009 | Braunstein et al. ........... 250/332 |

* cited by examiner

Primary Examiner — Dao H Nguyen
(74) Attorney, Agent, or Firm — Sherr & Vaughn, PLLC

(57) ABSTRACT

An image sensor according to embodiments may include a semiconductor substrate, photodiodes disposed over the semiconductor substrate, a dielectric layer formed over the photodiodes, a color filter layer formed over the dielectric layer, a planarization layer formed over the color filter layer, a phase change material formed over the planarization layer, and a plurality of microlenses formed over the planarization layer, wherein the phase change material is positioned in the microlens. Further, a method for manufacturing an image sensor according to embodiments may include forming a dielectric layer over a semiconductor substrate with a plurality of photodiodes, sequentially forming a color filter layer and a planarization layer over the dielectric layer, forming a phase change material over the planarization layer, forming a patterned phase change material by partially etching the phase change material, and forming microlenses over the planarization layer and the phase change material.

6 Claims, 4 Drawing Sheets

-Related Art-

Crack

IMAGE SENSOR AND METHOD FOR MANUFACTURING THE SAME

The present application claims priority under 35 U.S.C. 119 to Korean Patent Application No. 10-2008-0109293 (filed on Nov. 5, 2008), which is hereby incorporated by reference in its entirety.

BACKGROUND

Image sensors, as semiconductor devices converting an optical image into an electrical signal, may be largely classified into charge coupled device (CCD) image sensors and complementary metal oxide silicon (CMOS) image sensors. CMOS image sensors capture an image by sequentially detecting and switching electrical signals of unit pixels. A unit pixel may include at least a photodiode and a MOS transistor.

To attain bright and clear image quality in the CMOS image sensor, light should be maximally focused on the photodiode. A microlens, which may be made out of a photoresist, may be used for this. However, since the photoresist is not very hard and solid, defects may occur in the microlens involving silicon particles generated during wafer sawing. To guard against this problem, un-doped silicate glass (USG) is deposited on the microlens at low temperature. This may be called low temperature oxide (LTO).

Figure 10:
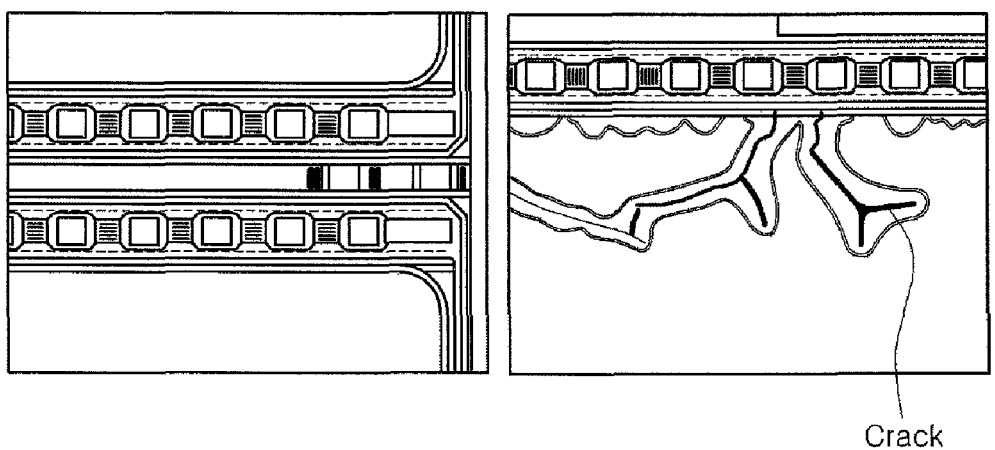

Meanwhile, since an oxide material formed at low temperature is a sparse film having many pores therein, the oxide material may be cracked by thermal stress generated in a subsequent process. As an example, a diagram of a photo showing a case in which a pixel area is cracked after a deterioration reliability test of the image sensor is shown in FIG. 10. As a result, the reliability of the device is degraded.

SUMMARY

Embodiments relate to an image sensor, and more particularly, to an image sensor and a method for manufacturing the same that can reduce defects in a microlens. Embodiments relate to the above-mentioned problem and provides an image sensor a manufacturing method that can reduce generation of defects such as a crack on a microlens, and an image sensor that prevents the crack from propagating to the microlens by forming a phase change material between microlenses of each unit.

An image sensor according to embodiments may include a semiconductor substrate, photodiodes disposed over the semiconductor substrate, a dielectric layer formed over the photodiodes, a color filter layer formed over the dielectric layer, a planarization layer formed over the color filter layer, a phase change material formed over the planarization layer, and a plurality of microlenses formed over the planarization layer, wherein the phase change material is positioned in the microlens.

Further, a method for manufacturing an image sensor according to embodiments may include forming a dielectric layer over a semiconductor substrate with a plurality of photodiodes, sequentially forming a color filter layer and a planarization layer over the dielectric layer, forming a phase change material over the planarization layer, forming a patterned phase change material by partially etching the phase change material, and forming microlenses over the planarization layer and the phase change material.

Embodiments relate to an apparatus configured to form a dielectric layer over a semiconductor substrate with a plurality of photodiodes, sequentially form a color filter layer and a planarization layer over the dielectric layer, form a phase change material over the planarization layer, form a patterned phase change material by partially etching the phase change material, and form microlenses over the planarization layer and the phase change material.

DRAWINGS

Figure 1:
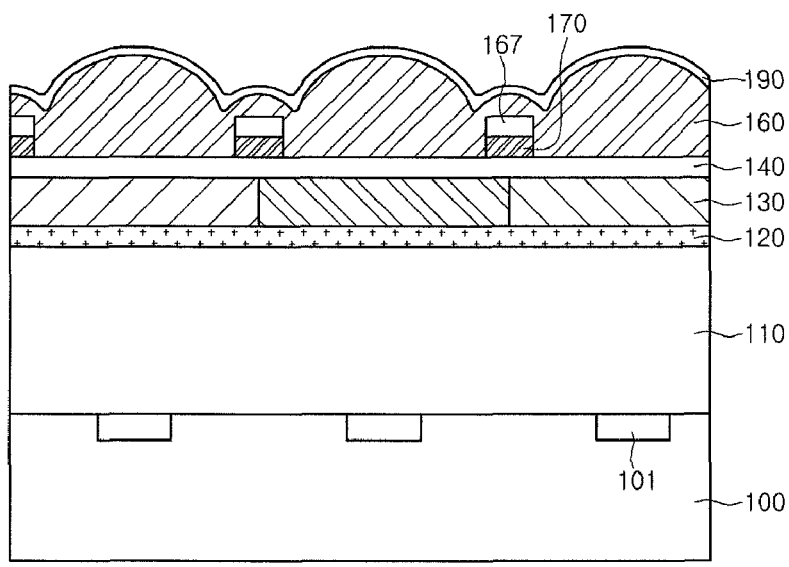

Example FIG. 1 is a diagram for describing a configuration of an image sensor according to embodiments.

Figure 2:
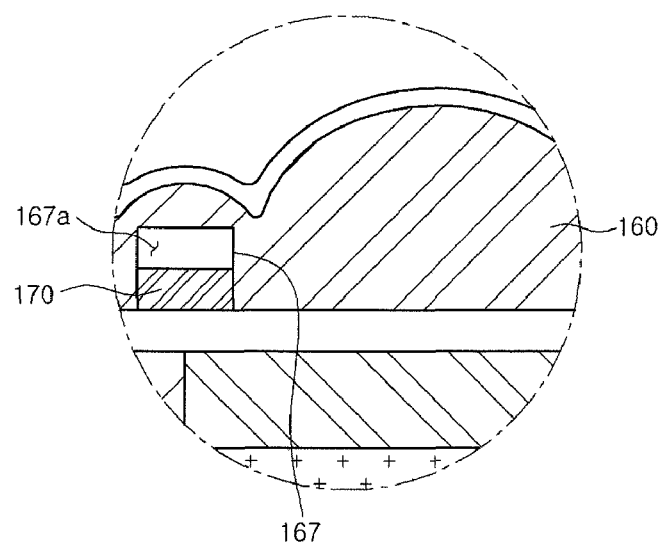
Figure 3:
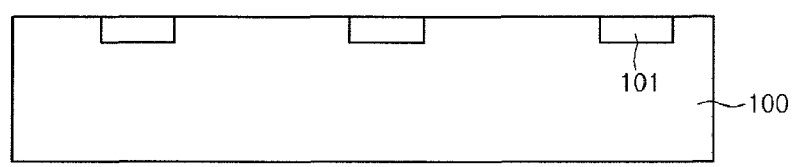

Example FIG. 2 is a diagram showing a state where a phase change material is formed at a region between microlenses in detail according to embodiments.

Example FIGS. 3 to 9 are diagrams for describing a method for manufacturing an image sensor according to embodiments.

FIG. 10 is a diagram of a photo showing a case where a pixel area is cracked after a deterioration reliability test of an image sensor.

DESCRIPTION

Example FIG. 1 is a diagram for describing a configuration of an image sensor according to an embodiment and example FIG. 2 is a diagram showing a state where a phase change material is formed at a region between microlenses in detail according to embodiments.

First, referring to example FIG. 1, the image sensor according to embodiments may include one or more photodiodes 101 that are formed over a semiconductor substrate 100 to generate electric charges depending on the amount of incident light. A dielectric layer 110 may be formed over the semiconductor substrate 100 including the photodiodes 101. A passivation layer 120 may be formed over the dielectric layer 110. An RGB color filter layer 130 may be formed over the passivation layer 120 to transmit light having a predetermined wavelength band. A planarization layer 140 may be formed over the color filter layer 130 that is configured in a convex shape having a predetermined curvature over the planarization layer 140 to induce focusing of light.

The image sensor according to embodiments may further include an LTC layer 190 configured to cover a top surface of the microlens 160. In particular, a phase change material 170 may be formed in the microlens 160. A predetermined space 167 may be formed in the microlens 160 due to a decrease of volume generated by a phase change of the phase change material 170.

The phase change material 170 may be formed over the planarization layer 140. After the phase change material 170 is formed, the phase of the material may be changed by heat generated during a forming process of the microlens or other subsequent processes. As a result, the predetermined empty space 167 is formed in the microlens 160 due to the decrease of volume of the phase change material 170.

In that the microlenses 160 are formed at positions corresponding to filters of the color filter layer 130, respectively, the phase change material 170 can be formed over areas connected to the color filters 130. That is, if the microlens 160 is constituted by a plurality of lenses corresponding to the filters of the color filters 130, the phase change material 170 may be positioned in a region between the lenses.

The phase change material 170 will be described with reference to matters illustrated in example FIG. 2. The phase change material 170 may be made of $Ge_2Sb_2Te_5$, Ge—Te, Sb—Te-based materials, etc. Volumes of the phase change materials are changed by surrounding heat.

The volume of the phase change material 170 is changed by generation of the surrounding heat. As a result, the predetermined inner space 167 is formed in the region between the lenses constituting the microlens 160. An air layer 167a is formed in the inner space 167 due to a decrease in volume of the phase change material 170. The inner space prevents a crack generated outside of the lens from propagating to each lens. That is, the predetermined air layer 167a generated by the change in volume of the phase change material 170 prevents a crack generated in a subsequent process from being propagated to each of the lenses constituting the microlens.

Further, since the phase change material 170 has a metallic property, the phase change material can serves as a cross talk guide by light. That is, as the phase change materials 170 are formed in the region between the lenses, light incident to the phase change material 170 is refracted by the phase change material 170, thereby helping the light be focused on the photodiode.

Example FIGS. 3 to 9 are diagrams for describing a method for manufacturing an image sensor according to embodiments. First, referring to example FIG. 3, one or more photodiodes 101 generating electric charges depending on the amount of incident light may be formed over the semiconductor substrate 100.

Figure 4:
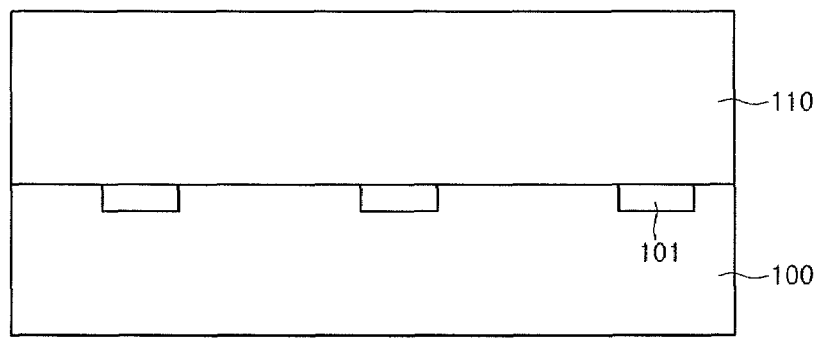

Next, referring to example FIG. 4, the dielectric layer 110 for interlayer isolation may be formed over the semiconductor substrate 100 with the photodiodes 101. Although it is shown that a single dielectric layer 100 is formed over the top of the photodiodes 101, a plurality of dielectric layers and metal lines for electrical interlayer connection may be further formed in embodiments.

Figure 5:
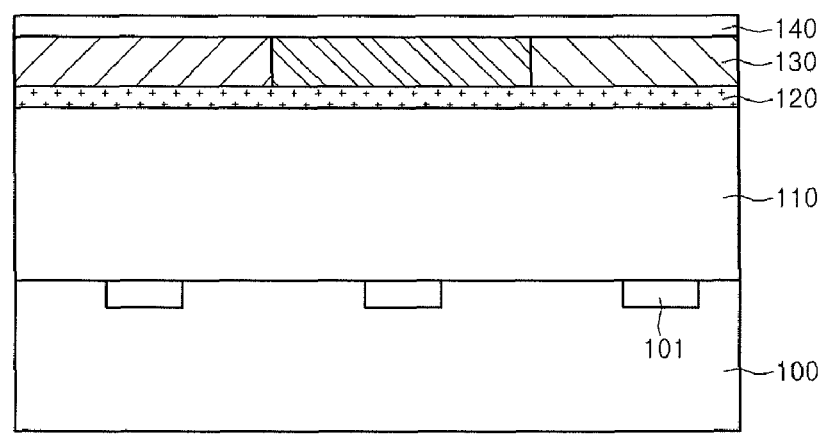

Next, referring to example FIG. 5, the planarized passivation layer 120 for protecting the device from moisture or a scratch may be formed over the dielectric layer 110. The RGB color filter layer 130 that filters light for each wavelength band may be formed over the passivation layer 120 by performing coating and patterning processes using a flammable resist. In addition, the planarization layer 140 may be formed over the color filter layer 130 in order to assure planarity for adjusting a focal distance and forming a lens layer.

Figure 6:
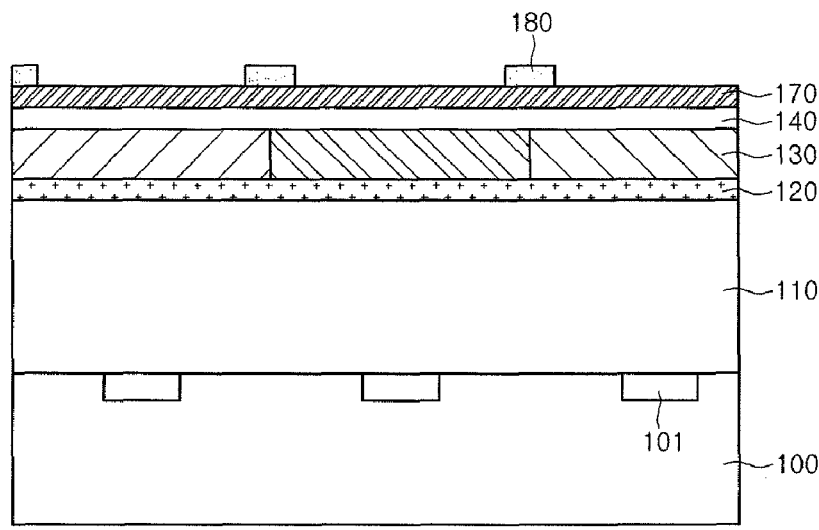

Next, referring to example FIG. 6, the phase change material 170, having a predetermined thickness, may be formed over the planarization layer 140. In addition, a photoresist pattern 180 may be formed over the phase change material 170 in order to pattern the phase change material.

In particular, the phase change material remaining after partially etching the phase change material 170 may be formed in a connection area of each microlens to be described below. Therefore, the phase change material may be formed vertically above the area between the photodiodes of the unit pixels. In other words, in the process of partially etching the phase change material 170, the phase change materials to be partially etched are positioned in an area where the microlens is formed or an area corresponding to the photodiode.

Figure 7:
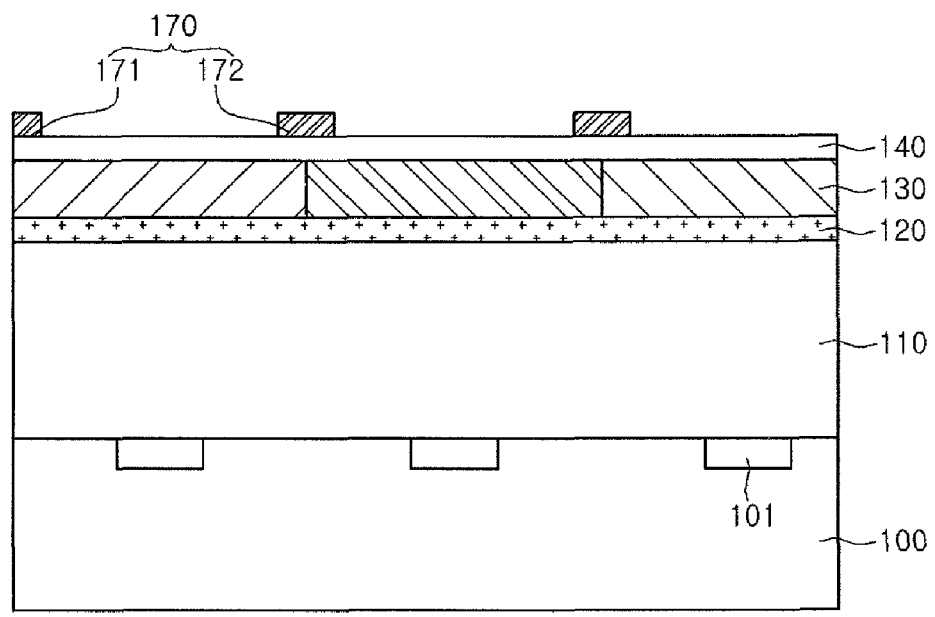

Next, referring to example FIG. 7, by the etching process of the phase change material 170 using the above-mentioned photoresist pattern 180, the phase change material 170 may be formed as shown in the figure. For example, a first phase change material 171 positioned in an area between a first microlens and a second microlens and a second phase change material 172 positioned in an area between the second microlens and a third microlens may be formed.

Figure 8:
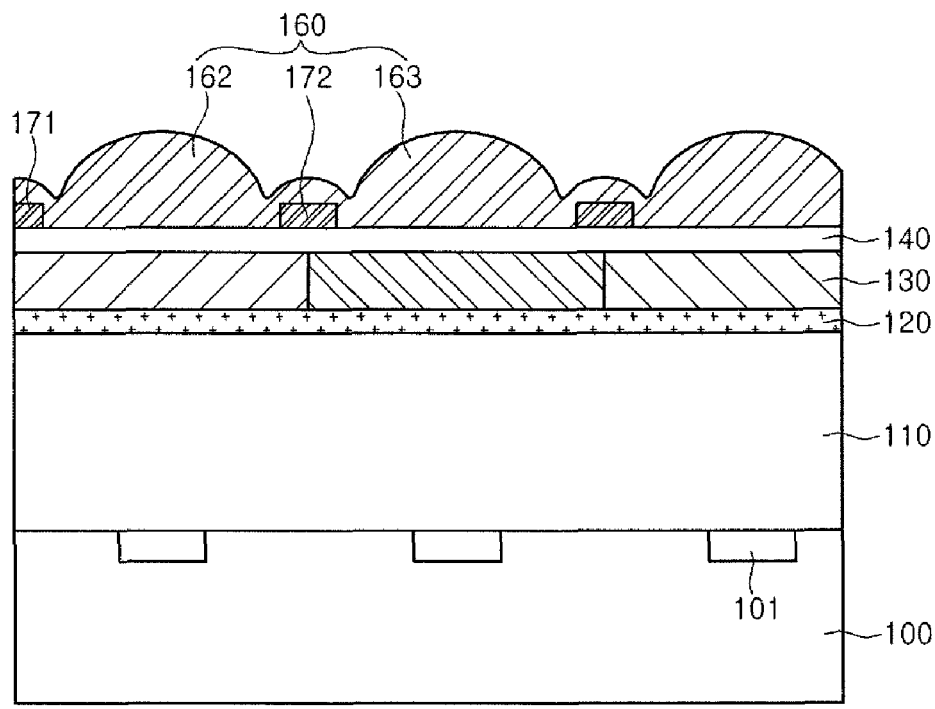

Next, referring to example FIG. 8, a layer such as the photoresist or SiON for forming the microlens may be formed over the phase change material 170 and the planarization layer 140. Subsequently, by selectively patterning the photoresist through photolithography and development processes, the microlens 160 may be formed having the shape shown in the figure. For example, the second microlens 162 and the third microlens 163 may be adjacent to each other and the second phase change material 172 may be formed in the area between the second microlens 162 and the third microlens 163.

Herein, the volumes of the phase change materials 170 may be reduced by heat generated while forming the microlens or heat generated in other subsequent processes. At this time, an additional thermal processing process does not need to be performed so as to change the phase of the phase change material 170. The reason why is if the thermal process is included in the subsequent processes, the phase of the phase change material 170 is changed by the thermal process.

Figure 9:
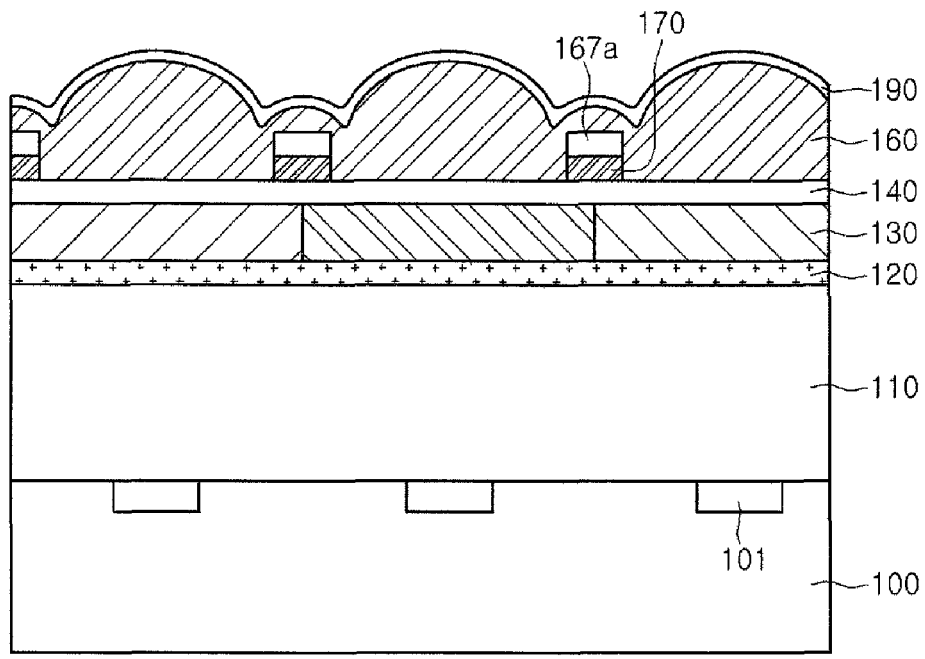

Next, referring to example FIG. 9, an LTO layer 190 may be formed so as to surround a top surface of the microlens 160. Even when the LTO layer 190 is formed in order to protect the surface of the microlens 160, predetermined heat is also generated, such that the phase of the phase change material 170 may be changed.

For example, the temperature required to change the phase of the phase change material 170 may be in the range of approximately 100 to 200 degrees. Since the photoresist can maintain its own property depending on the kind of the material, the phase of the phase change material 170 can be naturally changed by the heat generated by the other subsequent processes.

Further, by forming the phase change material 170 in the microlens 160, it is possible to prevent a crack from being propagated to the microlens. Since light is reflected and refracted by the phase change material 170, it is possible to induce light focusing.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
a semiconductor substrate;
photodiodes disposed over the semiconductor substrate;
a dielectric layer formed over the photodiodes;
a color filter layer formed over the dielectric layer;
a planarization layer formed over the color filter layer;
a phase change material formed over the planarization layer; and
a plurality of microlenses formed over the planarization layer,
wherein the phase change material is positioned in the microlens, and
wherein a predetermined inner space is provided in the microlens depending on a change of a phase of the phase change material.

2. The apparatus of claim 1, wherein the phase change material is positioned in an area between the microlenses.

3. The apparatus of claim 1, wherein the phase change material is made of a material of $Ge_2Sb_2Te_5$.

4. The apparatus of claim 1, wherein the phase change material is made of a material of Ge—Te.

5. The apparatus of claim 1, wherein the phase change material is made of a material of Sb—Te.

6. The apparatus of claim 1, wherein the microlenses are arranged over the photodiodes in a one-to-one correspondence.

* * * * *